United States Patent [19]

Lee

[11] Patent Number: 5,192,872
[45] Date of Patent: Mar. 9, 1993

[54] CELL STRUCTURE FOR ERASABLE PROGRAMMABLE READ-ONLY MEMORIES

[75] Inventor: Ruojia Lee, Boise, Id.

[73] Assignee: Micron Technology, Inc., Boise, Id.

[21] Appl. No.: 759,273

[22] Filed: Sep. 13, 1991

[51] Int. Cl.⁵ .......................................... H01L 29/68
[52] U.S. Cl. .................................... 257/315; 257/316; 257/401
[58] Field of Search ............... 357/23.5; 257/315, 316, 257/321, 366, 401

[56] References Cited

U.S. PATENT DOCUMENTS 4,853,895  8/1989  Mitchell et al. ................ 357/23.5
5,034,798  7/1991  Ohsima ........................... 357/23.5

FOREIGN PATENT DOCUMENTS 58-190065  11/1983  Japan ............................ 357/23.5

Primary Examiner—Andrew J. James
Assistant Examiner—Courtney A. Bowers
Attorney, Agent, or Firm—Stanley N. Protigal

[57] ABSTRACT

A design for EPROMs, EEPROMs, and Flash EEPROMs is described which greatly increases the coupling coefficient of the cell and enhances cell access speed. The increase in control gate to floating gate coupling is due to a decrease in the capacitance between the floating gate and the substrate, which includes the drain, source, and channel. This increase in the coupling coefficient will allow for a smaller cell size and better program and erase characteristics. A reduction in the capacitance between the floating gate and the transistor drain will reduce the so-called drain coupling effect. Severe drain coupling could increase undesirable drain-to-source leakage. Finally, a structure comprising the invention has a faster cell access time resulting from the fact that half the cell channel region is directly controlled by the control gate. This half of the channel region will see higher effective vertical electric field from the control gate than the channel region covered by the floating gate. A high transistor current will be generated, thereby increasing the speed of the cell.

22 Claims, 4 Drawing Sheets

CELL STRUCTURE FOR ERASABLE PROGRAMMABLE READ-ONLY MEMORIES

FIELD OF THE INVENTION

This invention relates to the field of semiconductor devices. More specifically, a cell structure for an Erasable Programmable Read-Only Memory (EPROM), Electrically Erasable PROM (E$^2$PROM), and Flash E$^2$PROM cell structure is described which has an improved coupling coefficient, reduced sensitivity to noise, faster access times, a higher tolerance for floating gate misalignment, and which requires a lower voltage to program or erase than previous PROM designs due to its higher coupling coefficient.

BACKGROUND OF THE INVENTION

EPROMs, E$^2$PROMs, and Flash E$^2$PROMs (hereafter collectively, PROMs) have several structures which allow them to hold a charge without refresh for extended periods of time. FIG. 1 shows a top view of a PROM array, FIG. 2 shows a cross section along "AA" of FIG. 1, and FIG. 3 shows a cross section along "BB" of FIG. 1. The charge itself is stored on a "floating gate" 10 also referred to as Poly 1 or P1, which is a structure of polycrystalline silicon (hereafter, poly) surrounded on all sides by a layer of oxide 12. Located superjacent and parallel to this P1 structure is another poly structure, the "control gate" 14 or P2. P1 10 and P2 14 act as the two plates of a capacitor. Below the P1 layer are two N+ junctions, one which acts as the transistor source 16 and the other as the drain 18, which are doped into a p-type substrate 20. The portion of the substrate 20 between the source 16 and the drain 18 is the channel 22. The cell of FIG. 1 functions like an enhancement-type n-channel metal oxide semiconductor field effect transistor (MOSFET) with two gates of poly.

There are many ways to program a PROM. In one technique, a potential such as for example 12 V, is applied on the control gate. Simultaneously, a voltage pulse, for example 8 V, is applied between source and drain. The large positive voltage on the control gate establishes an electric field in the insulating oxide. This electric field attracts the electrons generated from the so-called "avalanche breakdown" of the transistor due to the high drain and control gate voltages, and accelerates them toward the floating gate, which they enter through the oxide. In this way the floating gate is charged, and the charge that accumulates on it becomes trapped.

To return the floating gate from a charged state to a state with no charge, the electrons are caused to return to the substrate. In an EPROM, this is accomplished with ultraviolet light which excites the electrons past a certain energy state, thereby allowing them to pass through the oxide and return to the substrate. In an E$^2$PROM, this excitation is accomplished with an electrical field.

There are structures that make up a PROM array which are common to several transistors in the array. FIG. 1 is a top view of an array showing the transistor sources 16, drains 18, digit lines 24, floating gates 10, and control or "word" lines 26 which form control gates 14 as they pass over the floating gates 10. Also shown as a dotted line is the "active area" 28 interspersed with areas of field oxide 30. A single word line 26 is common to all transistors in a single column acting as a control gate 14 for all transistors in the column. When selected it activates all transistors in the column. The source regions 16, which run parallel with the control lines 26, are common to all transistors in two adjacent columns. Individual transistor drains 18 are common to two transistors in adjacent columns. The digit (or bit) lines 24 are common with the drains 18 of all transistors in a single row.

To read the datum on a floating gate 10, the control line 26 of the cell to be read is activated, for example by bringing it to between 2.5 V and 3.5 V, which causes all transistors in the selected column to become active. The voltage applied to the control gate 26 is above the threshold voltage ($V_T$) of a cell holding a "1" state, and below the threshold voltage of a cell storing a "0". If a cell is set to a zero, arbitrarily defined by storing −3 V on the floating gate 10, the potential between the control gate 26 and the transistor channel 22 is not high enough to trip the transistor. If a cell is set to a one, arbitrarily defined by storing 0 V on the floating gate 10, the potential between the control gate 26 and the channel 22 is high enough to trip the transistor. After the control gate 26 is activated, each cell along that control gate 26 outputs the cell information on their respective digit lines 24. The information on the digit line 24 which corresponds to the cell to be read is obtained with a sense amplifier (not shown), with one sense amp for each digit line.

Electrons stored on the floating gate can leak to the source, to the drain, or to the control gate thereby causing the floating gate to leak to ground, the floating gate's unprogrammed state. This will cause the transistor to trip accidentally.

Another phenomenon which occurs increasingly as cell sizes decrease and PROMs are made more densely is drain coupling. Drain coupling can occur due to the drain-to-floating-gate capacitance. When a voltage is applied to the drain during a read, for example, the influence of the floating gate on the channel can slightly forward bias the flow of electrons between the source and drain, thereby resulting in an undesired leakage of electrons between the drain and source. This can make it appear that the transistor has tripped, thereby indicating that the cell is not storing a charge when it actually is.

A PROM design which protects against the undesired phenomena listed above would be a desireable structure.

Referring to FIGS. 4 and 5, PROM designs have been used which have a control line 40 which passes over a floating gate 42 which is only a fraction of the length of a conventional PROM cell, for instance half the length of a conventional floating gate. (Note that for purposes of this disclosure, the term "length" indicates a direction of the channel or floating gate perpendicular with the word line, and "width" indicates a direction of the channel or floating gate parallel with the word line.) The floating gate 42 does not extend all the way between the source 16 and drain 18. The cross section along AA of FIG. 4 appears identical to the structure of FIG. 3, while the cross section along BB of FIG. 4 is shown in FIG. 5. In these types of "half-gate" designs, the control line 40 is of conventional size and extends completely across the channel 22. The distance across the control line 40 is therefore twice the distance across the fractional floating gate 42. Cells employing the floating gate 42 of decreased distance between the source 16 and drain 18 are an attempt to solve the over-erase (depletion mode) problem by inserting a conventional transistor as a part of the cell. The region of the cell wherein no floating gate 42 covers the channel 22 acts as the conventional transistor.

SUMMARY OF THE INVENTION

An object of the invention is to provide a PROM design which has higher control gate/floating gate coupling. A second object of the invention is to provide a PROM design which has faster access times than previous PROM designs. Another object of the invention is to provide an EEPROM design that has increased resistance to leakage of electrons from the floating gates than previous PROM designs. Yet another object of the invention is to provide a PROM design that has reduced leakage of electrons between the transistor sources and drains due to reduction in drain coupling. Another object of the invention is to provide a structure which has a high tolerance for floating gate misalignment. Another object of the invention is to provide a structure which requires a lower voltage to program or erase than previous PROM designs due to its higher coupling coefficient.

These objects of the invention are realized by fabricating a PROM structure in which the floating gate is shifted so as to cover a reduced width of the channel, for instance half the channel. The percentage of the floating gate which covers the channel can vary and still result in a viable cell, but 50% coverage is a desirable target. The size of the floating gate does not change, so the desired capacitance between the floating and control gates remains unchanged, while the areas of potential leakage between the floating gate and the source, drain, and channel are reduced. The value of the coupling coefficient is therefore increased, which produces a more solid cell.

DETAILED DESCRIPTION OF THE INVENTION

Figure 1:
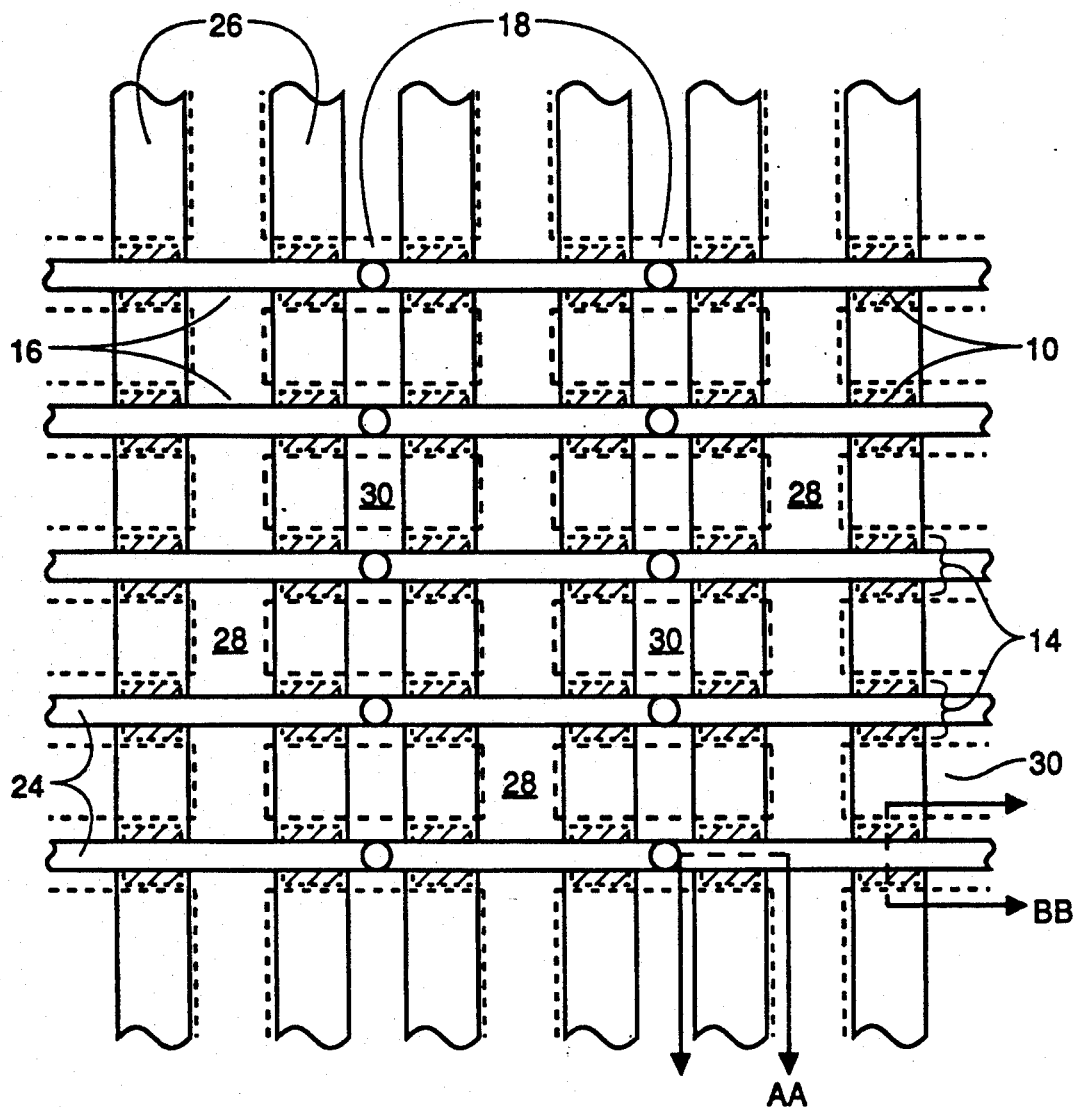
FIG. 1 shows a top view of a conventional PROM array.
Figure 2:
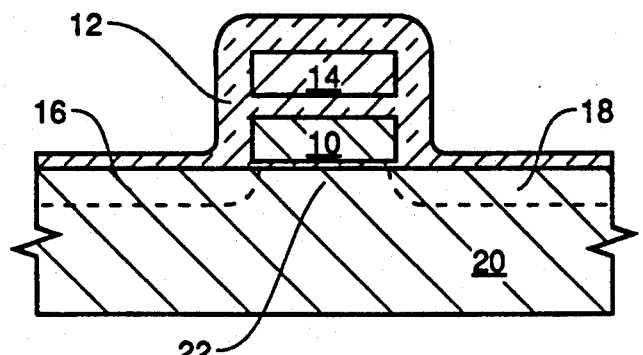
FIG. 2 shows a cross section of the conventional PROM array along AA of FIG. 1.
Figure 3:
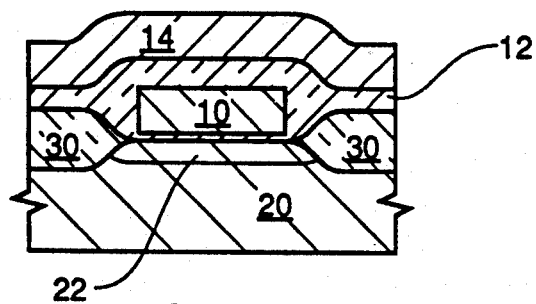
FIG. 3 shows a cross section of the conventional PROM array along BB of FIG. 1.
Figure 4:
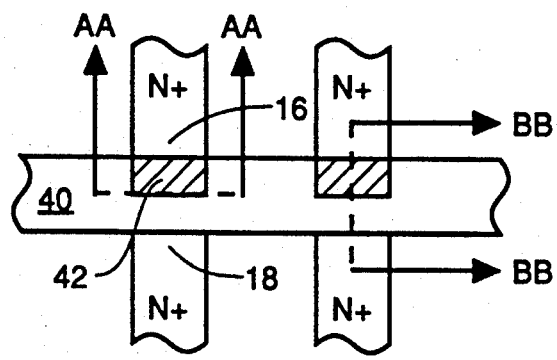
FIG. 4 shows a cell structure of previous design having a floating gate which covers only half the channel region between the transistor source and drain.
Figure 5:
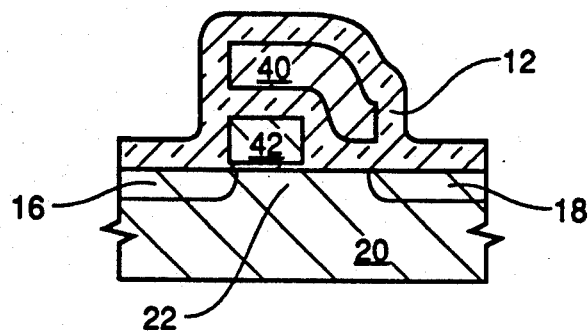
FIG. 5 shows a cross section along BB of FIG. 4.
Figure 6:
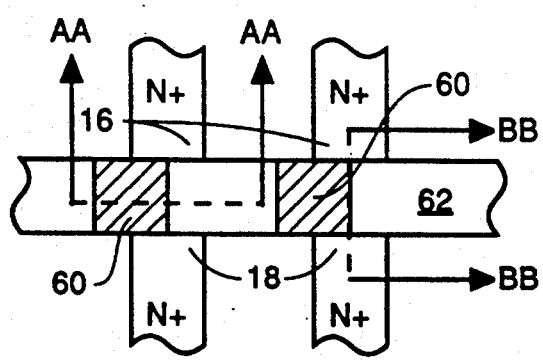
FIG. 6 shows a top view of two PROM cells comprising the inventive design.
Figure 7:
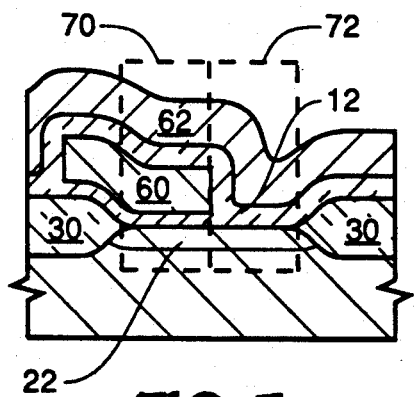
FIG. 7 shows a cross section of the inventive PROM design along AA of FIG. 6.
Figure 8:
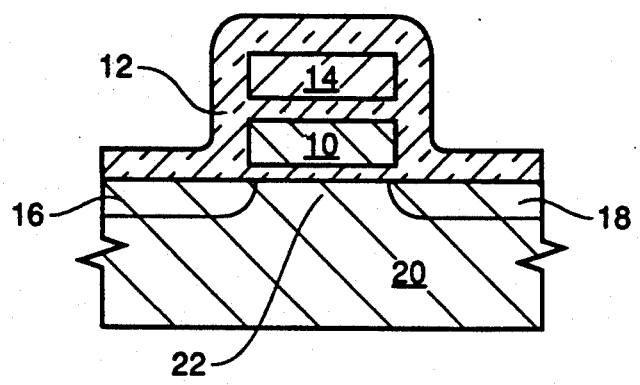
FIG. 8 shows a cross section of the inventive PROM design along BB of FIG. 6.

Referring to FIGS. 6, 7, and 8, a PROM structure is fabricated which has a floating gate 60 which is not centered over the channel 22, but instead is aligned away from its position in a conventional cell along the axis of the control line 62 and extends beyond the source 16, drain 18, and channel 22. The floating gate 60 extends over only a portion of the channel 22, for instance over half the channel region 22, but spans the distance between the source 16 and drain 18. FIG. 6 shows a top view of such an inventive cell, FIG. 7 shows a cross section along AA of FIG. 6, and FIG. 8 shows a cross section along BB of FIG. 6. Fabrication of the cell follows conventional PROM fabrication techniques, and requires only a change in the alignment of a mask during wafer fabrication. This is easily accomplished by an artisan of ordinary skill in the art. The reduction in the floating gate 60 width across the channel 22 resulting from the alignment of the mask as described during wafer fabrication provides for several advantageous effects on the operation of the cell, as described below. Unlike the "half-gate" described above, the floating gate 60 of the inventive structure extends all the way between the source 16 and drain 18, but is shifted to cover only half the channel 22 along the axis of the word line 62.

The inventive cell can be thought of as a pair of transistors, shown as 70 and 72 on FIG. 7. The first transistor 70 acts as a conventional PROM transistor. The second transistor couples the word line 62 directly with the channel 22.

Figure 9:
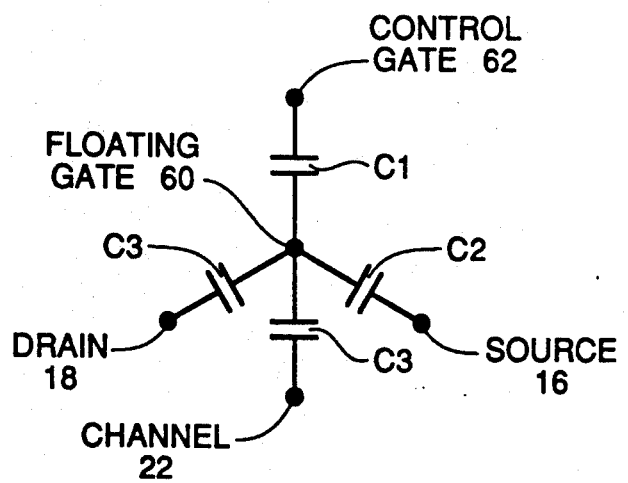
FIG. 9 is a schematic diagram of a the inventive PROM cell showing the capacitances present between the floating gate and the source, the drain, and the control gate.

Reducing the floating gate width across the channel increases the coupling coefficient of the cell, which implies many advantages to an artisan of ordinary skill. The floating gate of an EPROM forms a capacitor with the control gate, as described above, and also with the source, the drain, and the channel. Referring to FIG. 9, the coupling capacitances associated with P1 are described by the coupling coefficient, which is depicted by the equation $$CC = C1/(C1 + C2 + C3 + C4)$$

where CC is the coupling coefficient, C1 represents the coupling between the floating gate and the control gate, C2 represents the coupling between the floating gate and the source, C3 represents the coupling between the floating gate and the drain, and C4 represents the coupling between the floating gate and the channel. As can be determined from the equation, the coupling coefficient can never reach the ideal state (1.00) since the capacitance between the floating gate and the control gate is always divided by itself plus some additional capacitance. Still, the goal of designers is to bring the coupling coefficient as close to unity as possible. With the inventive cell, C2, C3, and C4 are reduced since the average distance from the floating gate and the source, the drain, and the channel is increased, thereby reducing their coupling. Since the size of the floating gate is not reduced, the coupling between the floating gate and control gates remains at its original level, as is desirable. Reducing the coupling between the floating gate and the substrate allows the cell size to be reduced while maintaining the desired high coupling between the control and floating gates. This characteristic also improves program and erase characteristics.

Figure 10:
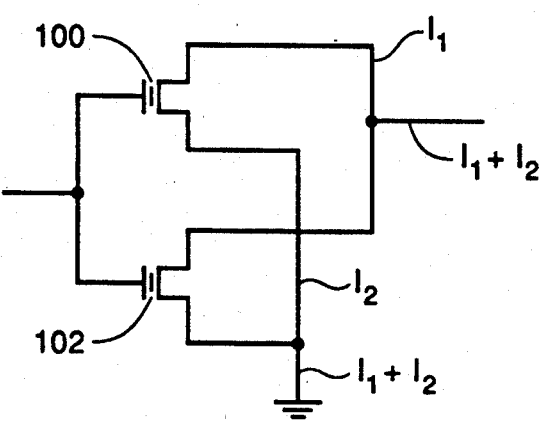
FIG. 10 is a schematic diagram of a conventional PROM cell having a floating gate extending completely over the channel region showing the currents at various points.

FIG. 10 shows a schematic of a conventional PROM cell. If the transistor is divided in half, thereby halving the control gate, the floating gate, the source, the drain, and the channel, the cell can be thought of as first 100 and second 102 transistors, each having the same electrical characteristics. When a conventional cell is not programmed (0 V on the floating gate), the total current through the transistor can be described by the equation:

$$I_{total}=I_1+I_2$$

When a conventional cell is programmed (−3 V on the floating gate), there is no current through the cell ($I_{total}=0$ V). In a conventional PROM, a sense amp has the capability only of detecting the presence or absence of voltage. If the PROM is installed in a particularly noisy environment, a sense amp can determine that a current is present on its input, when it is actually noise which is present. This would cause the sense amp to indicate the cell is not storing a charge, when it is.

Figure 11:
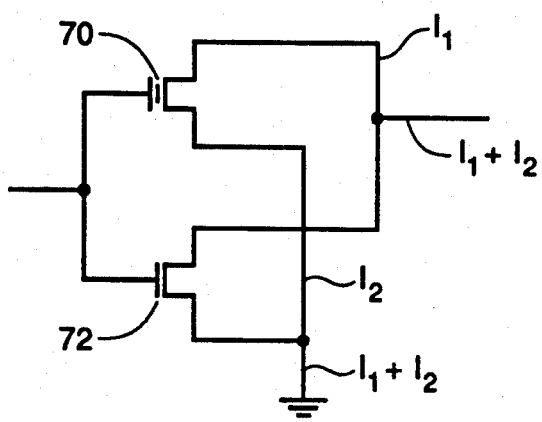
FIG. 11 is a schematic diagram of an inventive PROM cell having a floating gate extending over only a portion of the channel region showing the currents at various points.

FIG. 11 shows a schematic of a PROM cell comprising the inventive design. This cell can also be thought of as a pair of transistors. The first transistor comprises the area shown as 70 in FIGS. 7 and 11, namely the floating gate which is over the channel and the control gate over this region, the channel region covered by the floating gate, and the source and drain regions in line with the floating gate. The second transistor comprises the area shown as 72 in FIGS. 7 and 11, namely the control gate directly over the channel and this channel region, and the source and drain regions in line with this channel region. When an inventive cell is not programmed (0 V on the floating gate), the total current through the transistor can be described by the equation:

$$I_{total}=I_1+I_2$$

which is the same as a conventional cell. When an inventive cell is programmed (−3 V on the floating gate) however, $$I_{total}=I_2$$

As previously stated, the sense amp of a conventional cell determines the presence or absence of a voltage. With the inventive cell since, at a minimum, $I_2$ passes through the transistor. The sense amp senses whether a voltage is above or below a threshold value, not just the presence or absence of the voltage. Noise only adds to the total voltage in the inventive cell, while in a conventional cell a sense amp would detect the noise, thereby indicating a voltage was present. The inventive PROM can be designed so the value of most any voltage from noise would not be enough to cause the sense amp to indicate the cell is not programmed when it actually is.

Decreasing the width of the floating gate across the channel also decreases the leakage between the source and the drain. In a conventional cell, leakage could occur between the transistor source and drain because of the potential between the floating gate and the channel which slightly forward biases the flow of electrons between the source and drain. This results in a low level leakage between the transistor source and drain which can cause the transistor to appear that it has tripped, when it is storing a high. In the inventive cell, leakage resulting from a potential between the floating gate and the channel can occur only over the portion of the channel covered by the floating gate, and not over the area not covered by the floating gate. The area over which this "punchthrough" can occur is decreased, and the leakage is therefore also decreased.

Decreasing the floating gate width across the channel decreases leakage of a charge stored on the floating gate. With any PROM design, charge can leak from the floating gate to the control gate, to the source, and to the drain. The charge leaks from the floating gate most easily to a node in close proximity to the floating gate. The greater the surface area of the node which is in close proximity to the floating gate, the greater the leakage to that node. In a conventional cell, leakage can occur to the drain (and also the source) most easily along the entire width of the floating gate since the distance from the drain to the floating gate is approximately the same along the entire width of the floating gate. With the inventive cell, the area though which leakage between the floating gate and the drain (and also the source) occurs is decreased approximately by the amount the floating gate is shifted since the distance from the drain to the floating gate is not the same along the entire width of the floating gate. Since the surface area of the drain which is in close proximity to the floating gate is decreased, the leakage is decreased. This is even more significant if a tunneling window is presented.

Decreasing the floating gate width across the channel increases the speed of the device. Half the cell channel region is directly controlled by the control gate, and this half of the channel region will see higher effective vertical voltage. A high transistor current will be generated, thereby increasing the speed of the cell.

In the inventive structure, the floating gate 60 can remain the size of previous designs, being roughly the width of the transistor channel 22, but is aligned so as to cover only part (for example half) of the channel width. This maintains a high capacitance between the floating gate 60 and word line 62, yet serves to provide several advantages over a conventional structure.

When an access is not being performed on the inventive cell, leakage is likely to occur only through the channel region covered by the floating gate, and not through the region of the channel not covered by the floating gate. The leakage can occur from the potential between the floating gate and the channel influencing the free electrons within the channel, thereby setting up a current between the source and drain regions. This noise can cause the transistor to falsely trip.

When an access is being performed on the cell, the potential between the floating gate and channel influences the free electrons in the channel region, thereby setting up a field in the upper channel region. During a memory access in a conventional cell storing a one (0 V), the control gate is biased to a voltage of between 2.5 V and 3.5 V, although other voltages are possible depending on the transistor. The inventive cell requires a similar voltage on the control gate to trip the transistor if the floating gate is storing 0 V. A different reference current point, however, may be required for the sense amps in the inventive cell, since a current passes through the transistor channel whether the transistor is on or off.

The inventive structure reduces leakage of the charge from the floating gate. The charge on the floating gate can leak to the source, to the drain, or to the control gate. With the inventive cell, the area of close contact between the floating gate and the source, and between the floating gate and the drain, is decreased, thereby decreasing the area through which leakage can occur. This improves the coupling coefficient between the control gate and floating gate.

What have been described are specific configurations of the invention, as applied to particular embodiments. Clearly, variations can be made to the original designs described in this document for adapting the invention to other embodiments. For example, the actual sizes of the any PROM structures can vary, and the proportion of the channel width that the floating gate is shifted across the channel can also vary. The amount of variation can cover a wide range, from between about 10% coverage to about 90% coverage of the channel region by the floating gate. In general, the floating gate will cover between about 40% to 60% of the channel, with a target of about 50% coverage being optimal in most instances. Also, the materials from which the structure is manufactured is unimportant. The substrate can be silicon, gallium arsenide, or any workable material. For instance, the substrate can be N-type material doped with P-type material to form wells, or a P-type material can be doped to form N-type wells. Therefore, the invention should be read as limited only by the appended claims.

I claim:

1. A semiconductor device having a transistor comprising:
   a) a transistor source;
   b) a transistor drain;
   c) a transistor channel interposed between said source and said drain;
   d) a gate having first and second segments, said first segment being substantially centered between and in a superior plane to said source and said drain and over a portion of said channel, and said second segment extends beyond said channel, said source, and said drain,
whereby said second segment extension results in an improved coupling coefficient of the transistor.

2. The semiconductor device of claim 1 wherein the width of said first segment is approximately equal to the width of said second segment.

3. The semiconductor device of claim 1 wherein a current passes between said source and said drain through said channel when the transistor is at a "0" state and when the transistor is at a "1" state.

4. The semiconductor device of claim 3 further comprising a sense amp which detects a first voltage level when said transistor is at a "0" state and a second voltage level when said transistor is at a "1" state.

5. The semiconductor device of claim 1 wherein said gate covers between 10% and 90% of said channel.

6. The semiconductor device of claim 1 wherein said gate covers between 40% and 60% of said channel.

7. A semiconductor device having a transistor comprising:
   a) a control gate;
   b) a transistor source;
   c) a transistor drain;
   d) a transistor channel interposed between said source and said drain and under said control gate;
   e) a floating gate having first and second segments, said first segment being substantially centered between and in a superior plane to said source and said drain and interposed between said channel and said control gate, and said second segment is under said control gate and extends beyond said channel, said source, and said drain, wherein said floating gate is over only a portion of said transistor channel thereby reducing leakage of a charge stored on said floating gate from said floating gate to said transistor channel.
whereby said second segment extension results in an improved coupling coefficient of the transistor.

8. The semiconductor device of claim 7 wherein the width of said first segment is approximately equal to the width of said second segment.

9. The semiconductor device of claim 7 wherein a current passes between said source and said drain through said channel when the transistor is at a "0" state and when the transistor is at a "1" state.

10. The semiconductor device of claim 9 further comprising a sense amp which detects a first voltage level when said transistor is at a "0" state and a second voltage level when said transistor is at a "1" state.

11. The semiconductor device of claim 7 wherein said floating gate is over between 10% and 90% of said channel.

12. The semiconductor device of claim 7 wherein said floating gate is over between 40% and 60% of said channel.

13. A programmable read-only memory device having a transistor comprising:
   a) a control gate;
   b) a transistor source;
   c) a transistor drain;
   d) a transistor channel interposed between said source and said drain and under said control gate;
   e) a floating gate having first and second segments, said first segment being substantially centered between and in a superior plane to said source and said drain and interposed between said channel and said control gate, and said second segment is under said control gate and extends beyond said channel, said source, and said drain, wherein said floating gate is over only a portion of said transistor channel thereby reducing leakage of a charge stored on said floating gate from said floating gate to said transistor channel,
whereby said second segment extension results in an improved coupling coefficient of the transistor.

14. The programmable read-only memory device of claim 13 wherein the width of said first segment is approximately equal to the width of said second segment.

15. The programmable read-only memory device of claim 13 wherein a current passes between said source and said drain through said channel when the transistor is at a "0" state and when the transistor is at a "1" state.

16. The programmable read-only memory device of claim 15 further comprising a sense amp which detects a first voltage level when said transistor is at a "0" state and a second voltage level when said transistor is at a "1" state.

17. The programmable read-only memory device of claim 13 wherein said gate is over between 10% and 90% of said channel.

18. The programmable read-only memory device of claim 13 wherein said gate is over between 40% and 60% of said channel.

19. The semiconductor device of claim 1 wherein said gate is over only a portion of said transistor channel thereby reducing leakage of a charge stored on said gate from said gate to said transistor channel.

20. The semiconductor device of claim 1 wherein said gate is over about 50% of said channel.

21. The semiconductor device of claim 7 wherein said floating gate is over about 50% of said channel.

22. The programmable read-only memory device of claim 13 wherein said floating gate is over about 50% of said channel.

* * * * *